US006836351B2

(12) United States Patent
Livingston et al.

(10) Patent No.: US 6,836,351 B2
(45) Date of Patent: Dec. 28, 2004

(54) QUANTUM-CONFINED STARK EFFECT QUANTUM-DOT OPTICAL MODULATOR

(75) Inventors: Peter Y. Livingston, Palos Verdes Estates, CA (US); Steven R. Holm, Redondo Beach, CA (US); Elizabeth T. Kunkee, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 19 days.

(21) Appl. No.: 10/283,947

(22) Filed: Oct. 30, 2002

(65) Prior Publication Data

US 2004/0085612 A1 May 6, 2004

(51) Int. Cl.[7] .............................................. G02B 6/10
(52) U.S. Cl. ..................................... 359/279; 359/248
(58) Field of Search ................................ 359/279, 245, 359/248; 257/14, 15, 17; 385/2, 3, 4, 8

(56) References Cited

U.S. PATENT DOCUMENTS

| | | | | | |
|---|---|---|---|---|---|
| 5,402,259 | A | * | 3/1995 | Lembo et al. | 359/245 |
| 5,550,670 | A | * | 8/1996 | Zielinski et al. | 359/248 |
| 6,122,414 | A | * | 9/2000 | Shimizu | 385/2 |
| 6,278,170 | B1 | * | 8/2001 | Komatsu | 257/458 |
| 6,281,030 | B1 | | 8/2001 | Shimizu | 438/31 |
| 6,294,794 | B1 | | 9/2001 | Yoshimura et al. | 257/14 |
| 6,558,995 | B1 | * | 5/2003 | Gilliland et al. | 438/181 |

OTHER PUBLICATIONS

D. Bimber, et al., "Quantum Dot Heterostructures," John Wiley and Sons, 1999, Chister USA.
W.–H. Chang, et al., "Photocurrent studies of the carrier escape process from InAs self–assembled quantum dots," Physical Review B, Sep. 15, 2000, vol. 62, No. 11, pp. 6959–6962, USA.
M. Guriolo, et al., "Dynamic quantum–confined Stark effect in self–assembled InAs quantum dots," Applied Physics Letters, Feb. 12, 2001, vol. 78, No. 7, pp. 931–933, USA.
F. Hache, et al., "Quantum–confined Stark effect in very small semiconductor crystallites," Applied Physics Letters, Oct. 9, 1989, pp. 1504–1506, vol. 55, No. 15, USA.

T.M. Hsu, et al., "Quantum–confined Stark effect in electroreflectance of As/In$_x$Ga$_{1-x}$As self–assembled quantum dots," Applied Physics Letters, Mar. 19, 2001, pp. 1760–1762, vol. 78, No. 12, USA.
I.E. Itskevich, et al., "Stark shift in electroluminescence of individual InAs quantum dots," Applied Physics Letters, Jun. 26, 2000, pp. 3932–3934, vol. 76, No. 26, USA.
Shu–Shen Li, et al., "Quantum confined Stark effects in InAs/GaAs self–assembled quantum dot," Journal of Applied Physics, Dec. 15, 2000, pp. 7171–7174, vol. 88, No. 12, USA.
Weidong Sheng, et al., "Enhanced intraband transitions with strong electric–field asymmetry in stacked InAs/GaAs self–assembled quantum dots," Physical Review B, Sep. 18, 2001, pp. 153302–1—153302–4, vol. 64, No. 15, USA.
Aizawa, Takuya, et al., "Observation of Field–Induced Refractive Index Variation in Quantum Box Structure," IEEE Photonics Technology Letters, IEEE Inc., New York, USA, vol. 3, No. 10, 1991, pp. 907–909.
Ravikumar, K.G., et al., "Analysis of Electric Field Effect in Quantum Box Structure and Its Application to Low–Loss Intersectional Type Optical Switch," Journal of Lightwave Technology, IEEE, New York, USA, vol. 9, No. 10, 1991, pp. 1376–1385.

* cited by examiner

Primary Examiner—Scott J. Sugarman
Assistant Examiner—Richard Hanig
(74) Attorney, Agent, or Firm—Robert M. Wallace

(57) ABSTRACT

A quantum-confined Stark effect quantum-dot optical modulator includes an interferometer having a beam splitter, first and second parallel optical branches fed by the beam splitter and a beam combiner fed by the first and second parallel optical branches and a laser for feeding a laser beam to the beam splitter. First and second optical phase shifters are provided in respective ones of the first and second parallel optical branches. Each optical phase shifter includes an intrinsic semiconductor crystalline planar layer and p-type and n-type planar semiconductor layers on opposite faces of the intrinsic semiconductor crystalline planar layer, the intrinsic layer lying in a plane parallel to a direction of propagation of the laser beam in the respective optical branch. The intrinsic layer has plural layers of planar arrays of quantum dots therein. A reverse bias D.C. voltage source is connected across the p-type and n-type layers.

29 Claims, 11 Drawing Sheets

QUANTUM-CONFINED STARK EFFECT QUANTUM-DOT OPTICAL MODULATOR

ORIGIN OF THE INVENTION

The United States Government has certain rights in this invention pursuant to FAR 52.227-12.

BACKGROUND OF THE INVENTION

Digital communications having the highest speed or bandwidth employ laser beams as optical carriers generally having carrier frequencies in the terahertz range that permit extremely high modulation bandwidths. The optical carrier signal is modulated by an RF information signal (such as a computer data stream or a video signal or the like) or many information signals on respective sub-carriers. One common method of modulation uses an optical modulator consisting of complementary electrically responsive optical phase shifters in each of two branches of an interferometer such as a Mach-Zehnder interferometer. The optical modulator (the interferometer with the complementary optical phase shifters) is interposed between the optical carrier source (a laser) and the communication channel (a fiber optic cable, for example).

Each electrically responsive optical phase shifter typically consists of an electro-optical element that imposes a phase shift on the optical carrier signal proportional to an applied voltage. The applied voltage is (or is derived from) the information signal. The amplitude range (amplitude deviation) of the applied voltage must be sufficient for the electrically responsive optical phase shifters to impose quarter wavelength phase shifts in opposite directions in each of the two branches of the interferometer (for a total net maximum phase shift between the two branches of a half wavelength) for maximum modulation of the optical carrier. The voltage deviation required to achieve this maximum deviation is referred to herein as the quarter wavelength excursion voltage. An amplifier may be employed to raise the peak modulation voltage to the required amplitude. Typically, quarter wavelength excursion voltage (i.e., the applied voltage peak deviation required to realize a quarter wavelength phase shift range in each optical phase shifter) is on the order of about a volt or more.

Bandwidth requirements for the information signal are constantly increasing, and the modulation frequency must be increased to meet such demands. Unfortunately, it is difficult to amplify the modulation voltage to the required level at extremely high modulation frequencies (e.g., 40 GHz or higher). Thus, information signal bandwidth is limited by the modulation voltage deviation required by each optical phase shifter to attain the desired quarter wavelength phase shift. One way around this problem would be to somehow decrease the voltage swing required by the optical phase shifter to impose the quarter wavelength phase shift. For example, in some types of electrically responsive optical phase shifters, an increase in length of the phase shifter reduces the voltage deviation required to realize a quarter wavelength phase shift on the optical carrier. Unfortunately, such an increase in size increases the effective capacitance of a semiconductor optical phase shifter, so that it is difficult to drive it at the desired high modulation frequency. Thus, it has seemed that the relatively large voltage deviation requirements of a typical optical modulator imposes a limit on the information signal bandwidth.

BRIEF SUMMARY OF THE INVENTION

The invention is embodied in an optical modulator requiring extremely low modulation voltages for full modulation of the optical carrier. The optical modulator consists of an interferometer formed on a substrate as semiconductor optical waveguides with a pair of branches and complementary electrically responsive optical phase shifters in the respective branches and driven by an RF modulating source in a "push-pull" arrangement in one embodiment. The optical phase shifters are themselves semiconductor structures integrated within the waveguides on the substrate. Each optical phase shifter employs the quantum-confined Stark effect to produce quarter wavelength optical phase shifts with extremely low modulation voltages (i.e., lower by one or two orders of magnitude relative to conventional devices). Each optical phase shifter consists of a reverse-biased p-i-n layered structure of electro-optical crystalline material with an array of quantum dots in the intrinsic layer of the PIN structure that promote formation of optically generated excitons in the intrinsic layer. Superimposing the information signal voltage in push-pull fashion on the D.C. bias voltage of the optical phase shifter in each branch causes the exciton energy level spacing therein to shift accordingly (in opposite directions in the two phase shifters) and produces in the complementary optical phase shifters concomitant opposing changes in refractive index (and therefore in phase shift) that follow the information signal amplitude. The deviation in bias voltage required to realize quarter wavelength phase shift in each optical phase shifter is an order of magnitude smaller than conventional optical modulators, leading to an order of magnitude increase in information signal bandwidth beyond current technology, a revolutionary advance in the art.

The D.C. offset of the bias voltage is chosen to coincide with regions of maximum change in refractive index. This choice minimizes the required swing in bias voltage required to realize a quarter wavelength phase shift by each optical phase shifter (e.g., as low as a 45 mV swing). The additional advantage of a large electro-refractive effect is that the electro-optical crystal length required to realize the quarter wavelength phase shift is reduced for a given modulation voltage. This reduced length reduces insertion losses. The RF frequency of the modulation signal is ultimately limited by the capacitive reactance of the modulator, which is proportional to the length of the modulator, as well as other parameters. As the modulation frequency increases, the modulator capacitive reactance decreases. When the modulator capacitive reactance equals the load resistance, the modulator efficiency falls to 50%. Hence the cut-off frequency is defined as that frequency for which the modulator capacitive reactance equals the load resistance (50 Ohms). The capacitance can be adjusted by adjusting various parameters of each optical phase shifter, such as the thickness of the intrinsic layer of the electro-optical PIN structure.

In one embodiment, a quantum-confined Stark effect optical modulator includes an interferometer having a beam splitter, first and second parallel optical branches fed by the beam splitter and a beam combiner fed by the first and second parallel optical branches and a laser for feeding a laser beam to the beam splitter. First and second optical phase shifters are provided in respective ones of the first and second parallel optical branches. Each optical phase shifter includes an intrinsic semiconductor crystalline planar layer and p-type and n-type planar semiconductor layers on opposite faces of the intrinsic semiconductor crystalline planar layer, the intrinsic layer lying in a plane parallel to a direction of propagation of the laser beam in the respective optical branch. The intrinsic layer has plural layers of planar arrays of quantum dots therein. A reverse bias D.C. voltage source is connected across the p-type and n-type layers. A pair of modulation source terminals is connected across the reverse bias D.C. voltage source whereby a modulation signal modulates the reverse bias voltage across the p-type and n-type layers.

The modulation source terminals of the first and second optical phase shifters are connected in opposite polarity (i.e., in push-pull fashion) to a dual output modulation source. The intrinsic layer undergoes a change in refractive index sufficient to impose a quarter wavelength phase shift on the optical signal in response to an RF modulation signal.

The quantum dots in the intrinsic layer anchor quantum-confined exciton states define an exciton (electron-hole pair) optical absorption line spectrum. The quantum-confined states decrease in energy level upon increase of the reverse bias voltage.

Each of the optical phase shifters produces a quarter wavelength phase shift whenever the reverse bias voltage is shifted in push-pull fashion by the quarter wavelength excursion voltage. The first and second optical phase shifters are operated in push-pull mode whereby a quarter wavelength shift in each optical phase shifter produces a total net phase shift of a half wavelength between the first and second optical phase shifters.

The p-type and n-type layers confine a major portion of the laser beam to the intrinsic layer. The p-type, n-type and intrinsic layers are formed of a semiconductor material having a band gap such that the material is nominally transmitting (low loss) at the wavelength of the laser beam. The quantum dots have a diameter, height and layer-to-layer spacing sufficient to form a potential wells capable of capturing exciton electron-hole pairs with sufficient binding energy to create atomic-like transition energy spectra. The transition energy spectra undergo a Stark effect downward shift in response to an increase in the reverse bias voltage with a corresponding shift in refractive index of the intrinsic layer, the shift in refractive index being sufficient to impose a phase shift on the laser beam in the intrinsic layer equal to a quarter wavelength of the laser beam whenever the increase in the reverse bias voltage reaches a quarter wavelength excursion voltage of the intrinsic layer.

DETAILED DESCRIPTION OF THE INVENTION

Figure 1:
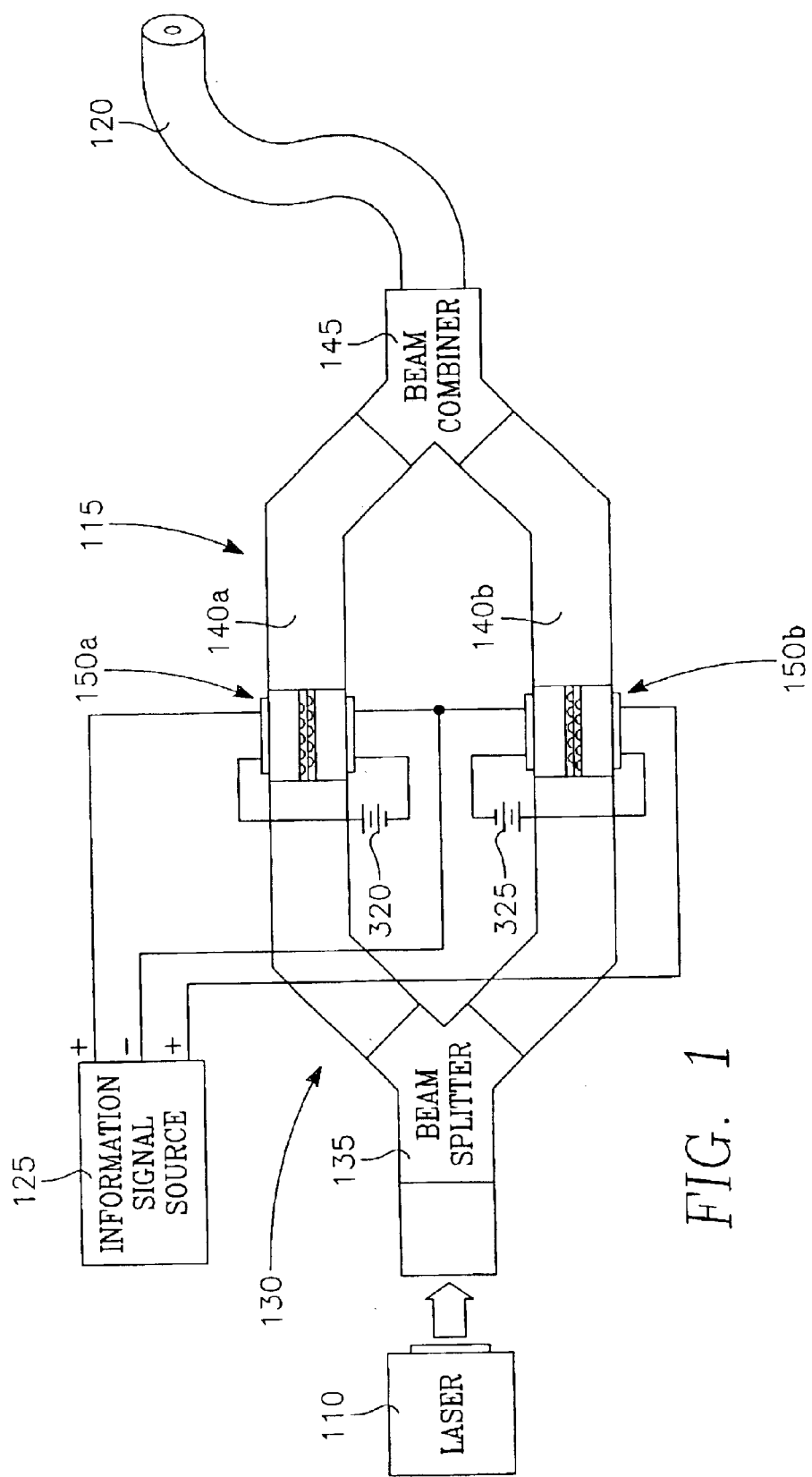
FIG. 1 is a block diagram of an optical modulator embodying the invention.
Figure 2A:
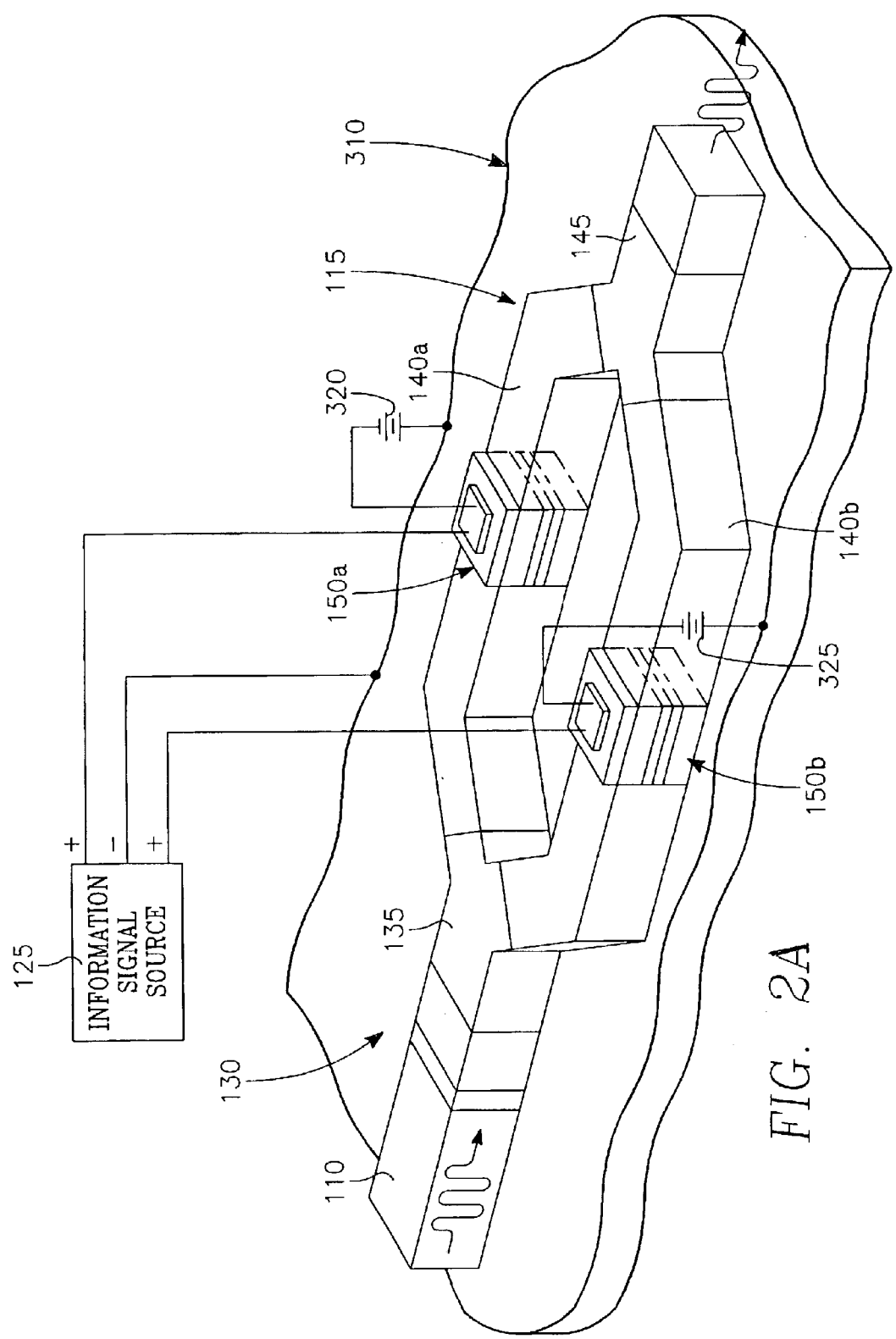
FIG. 2A is a perspective view of the optical modulator of FIG. 1.

Referring to the simplified block diagram of FIG. 1 and the corresponding perspective view of FIG. 2A, one portion of an optical communication system includes a laser 110, an optical modulator 115, an optical fiber 120 (that may be a small portion of an optical fiber network) and an information signal source 125. The optical modulator 115 is connected between the laser 110 and the optical fiber 120 and is controlled by an information signal from the information signal source 125. The optical modulator 115 consists of an interferometer 130 such as a Mach-Zehnder interferometer having a beam splitter 135 that splits the laser beam from the laser 110 into two beams, a pair of branches 140a, 140b through which the respective beams travel and a beam combiner 145 that recombines the two beams into one and feeds the recombined beam into the optical fiber 120. Within each branch 140a, 140b is an electrically responsive optical phase shifter 150a, 150b controlled by the information signal from the information signal source 125. For a given deviation in the information signal voltage, the optical phase shifters 150a, 150b impose equal and opposite phase shifts on the split laser beams in the respective interferometer branches 140a, 140b. The greater the deviation in the information signal voltage, the greater the opposing phase shifts. For a predetermined maximum deviation in the voltage of the information signal, the optical phase shifters 150a, 150b impose opposite quarter wavelength phase shifts. Since the phase shift in each branch 140a, 140b is opposite to the phase shift in the other branch, the total maximum phase shift between the two branches is a half wavelength. The half wavelength phase shift produces a minimal (or zero) optical intensity at the output of the beam combiner 145. A zero phase shift produces a maximum optical intensity at the output of the beam combiner 145. Unlike conventional optical phase shifters, the optical phase shifters 150a, 150b employ the quantum-confined Stark effect such that the voltage deviation required to produce a half wavelength excursion in phase shift between the two branches 140a, 140b is very small, on the order of millivolts, as will be described below.

Figure 2B:
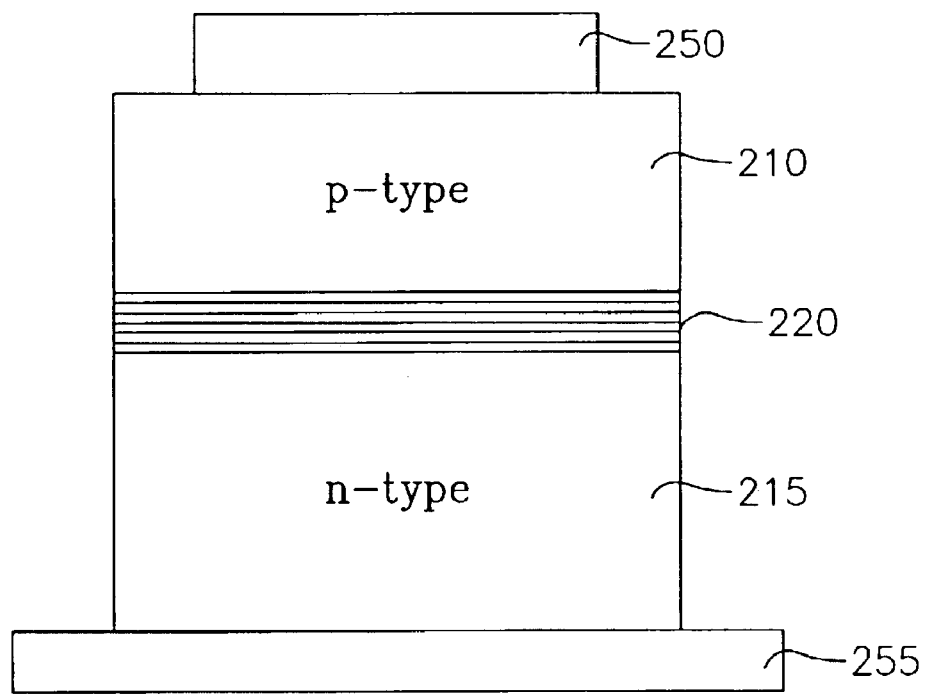
FIG. 2B is a cross-sectional view of an optical phase shifter in the optical modulator of FIG. 1.
Figure 2C:
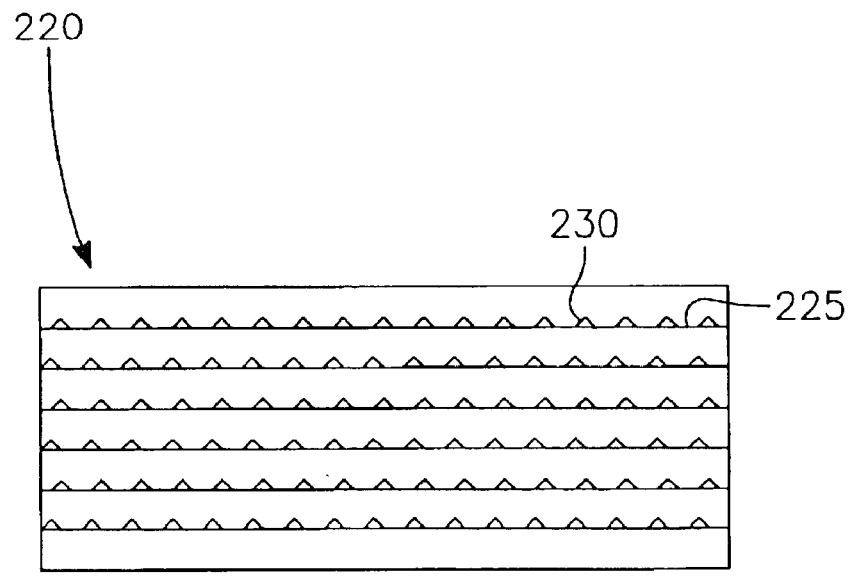
FIG. 2C is a cross-sectional view of a quantum dot-impregnated intrinsic layer in the optical phase shifter of FIG. 2B.

Each of the optical phase shifters 150a, 150b is formed as a layered semiconductor PIN structure visible in FIGS. 1 and 2A and shown in detail in the exploded view of FIG. 2B. The PIN structure is the same in each optical phase shifter 150a, 150b and consists of a top semiconductor layer 210 containing of p-type conductivity (i.e., containing acceptor dopant impurities), a bottom semiconductor layer 215 having n-type conductivity (i.e., containing donor dopant impurities) and an undoped or intrinsic semiconductor intermediate layer 220 between the p-type and n-type doped layers 210, 215. The semiconductor material is selected to have a valence-to-conduction energy band gap greater than the photon energy of the laser beam. For a laser beam wavelength of about 1.3 microns, the semiconductor material can be Al(0.3)Ga(0.7)As in each of the three layers 210, 215, 220, the AlGaAs crystal doped with p-type impurities in the top layer 210, no impurities in the intermediate layer 220 and n-type impurities in the bottom layer 215. Referring to FIG. 2C, the intermediate or intrinsic layer 220 contains parallel planar layers 225, each layer 225 being an array of quantum dots 230. Such quantum dots are disclosed in numerous publications such as Sheng et al., "Enhanced intraband transitions with strong electric-field asymmetry in stacked InAs/GaAs self-assembled quantum dots", *Physical Review B*, Volume 64, 153302-1 through 153302-4 (2001). The thicknesses of the layers 210, 215, 220 are selected so that the PIN structure serves as an optical waveguide for the laser beam, with the beam centered on and mainly confined within the intrinsic layer 220. For a 1.3 micron wavelength laser beam, the thickness of the p-type layer 210 and the n-type layer 215 is about one micron, while the thickness of the intrinsic layer 220 is about 0.5 micron, and the total waveguide cross-sectional area is about 3×3 square microns. The structure of the quantum dots 230 is selected to promote tightly bound exciton (electron and hole) ground states in the quantum dots near in energy to the laser beam wavelength. For example, the following quantum dot structure and materials selection led to an exciton ground state in the quantum dot of 1.24 microns, which is slightly above the energy of the 1.3 micron laser beam: quantum dot radius: 10 nm (nanometers), quantum dot height: 4 nm; number of quantum dot layers in the intrinsic layer: ten; separation between adjacent quantum dot layers: 40 nm; planar density of the quantum dots: $5 \times 10^{11}$ per square cm.

The PIN structure is reverse biased by application of a D.C. bias voltage. For this purpose, a p-ohmic metal contact layer 250 is formed in the conventional manner on the top surface of the p-type layer 210 as shown in FIG. 2B. In addition, a highly doped n-type GaAs contact layer 255 is provided on the bottom surface of the n-type layer 215. The D.C. reverse bias voltage is applied between the two contact layers 250, 255.

The entire optical modulator is formed on a crystalline semiconductor substrate 310 as shown in FIG. 2A. The beam splitter 135, the two branches 140a, 140b and the beam combiner 145 are crystalline structures formed on the top surface of the substrate 310. Each branch 140a, 140b is an optical waveguide having about a 3 micron×3 micron waveguide area. For a laser beam wavelength of about 1.3 microns, each optical phase shifter 150a, 150b is about 50 microns in length while the entire interferometer (from the input end of the beam splitter 110 to the output end of the beam combiner 145) is about 100 to 200 microns in length. The laser 110 is a semiconductor diode laser and may be formed on the substrate 310 integrally with the optical modulator.

D.C. reverse bias voltage sources 320, 325 are connected across the contacts 250, 255 of each of the optical phase shifters 150a, 150b so as to reverse-bias the PIN structures thereof. The optical shifters 150a, 150b are operated in push-pull mode and are therefore connected in opposite polarities across the information signal source, as shown in FIGS. 1 and 2A, so that the information signal modulates the negative bias voltages of the two optical phase shifters in opposite directions. In this way, a given change in information signal magnitude causes a decrease in phase delay in one optical phase shifter and an increase in the other. This feature reduces by a half the change in information signal voltage (RF modulation) required to produce an excursion of a half wavelength in phase difference between the phase shifters 150a, 150b (and therefore the two interferometer branches 140a, 140b). A phase shift between the two branches 140a, 140b of a half wavelength produces complete destructive interference between the beams in the two branches and therefore the minimal optical intensity (e.g., zero intensity) at the output of the combiner 145, while a phase shift of zero produces constructive interference of the two beams for maximum optical intensity. The excursion range of the information signal is adjusted so that the top and bottom of that range correspond to a phase shift range (between the two branches 140a, 140b) from zero to a half wavelength. The change in information signal voltage required to produce opposing shifts in phase of a quarter wavelength in the phase shifters 150a, 150b is referred to herein as the quarter wavelength excursion voltage. The quarter wavelength excursion voltage of each phase shifter 150a, 150b is extremely low (on the order of 45 millivolts in one example).

Figure 3A:
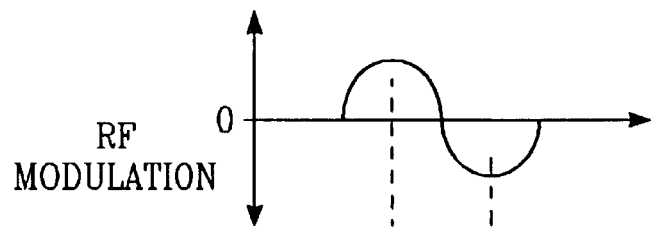
FIGS. 3A through 3H are contemporaneous timing diagrams illustrating the push-pull operation of the complementary optical phase shifters in the optical modulator of FIG. 1.
Figure 3B:
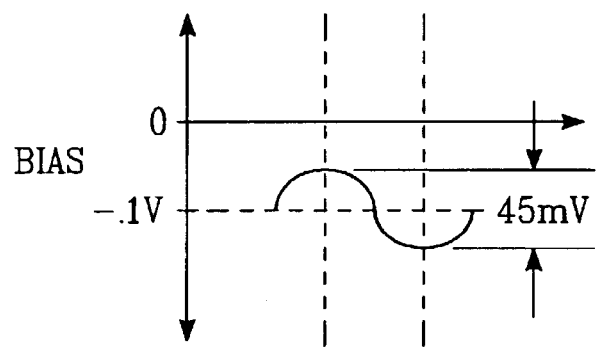
Figure 3C:
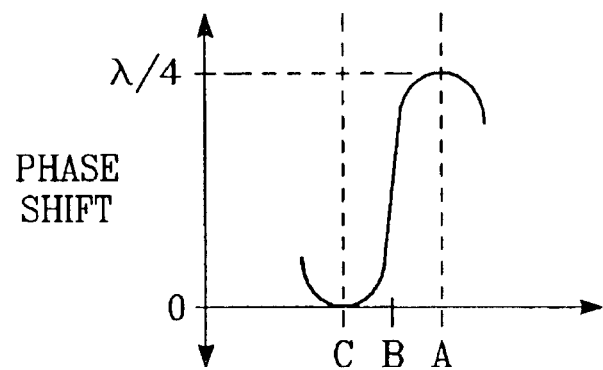
Figure 3D:
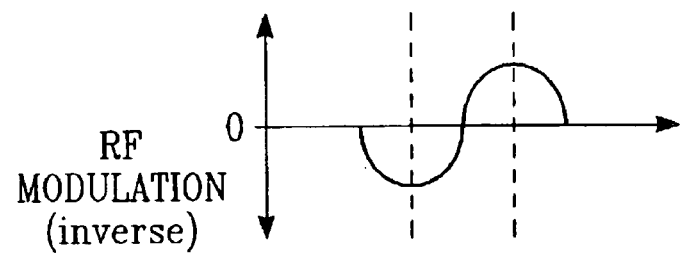
Figure 3E:
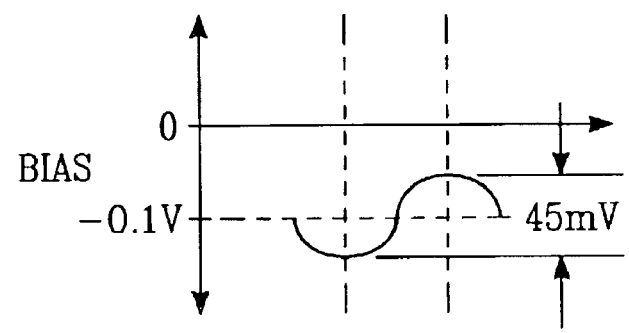
Figure 3F:
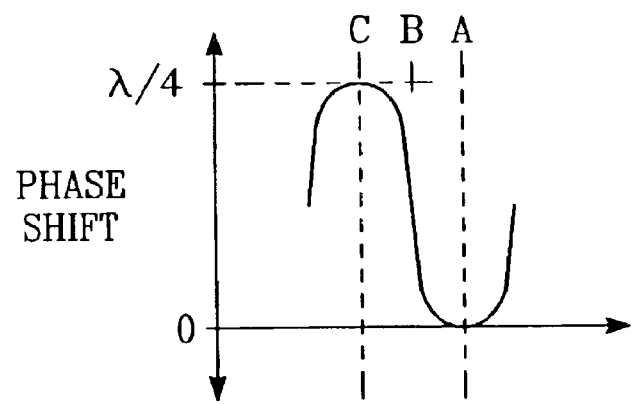
Figure 3G:
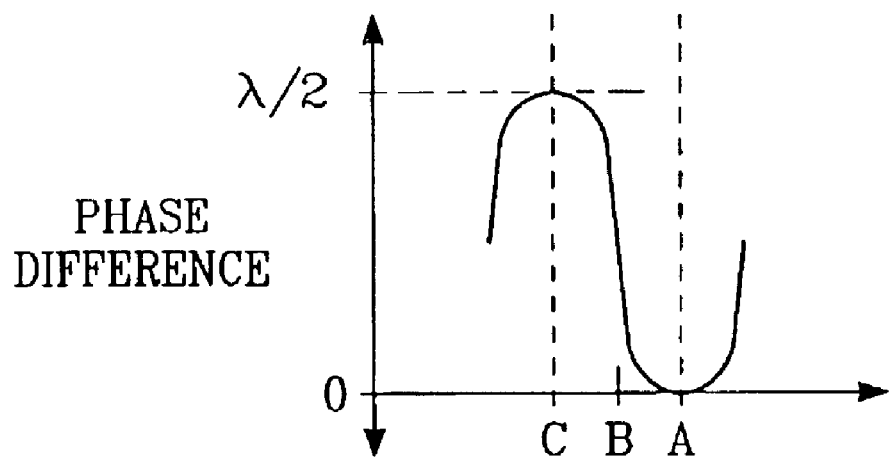
Figure 3H:
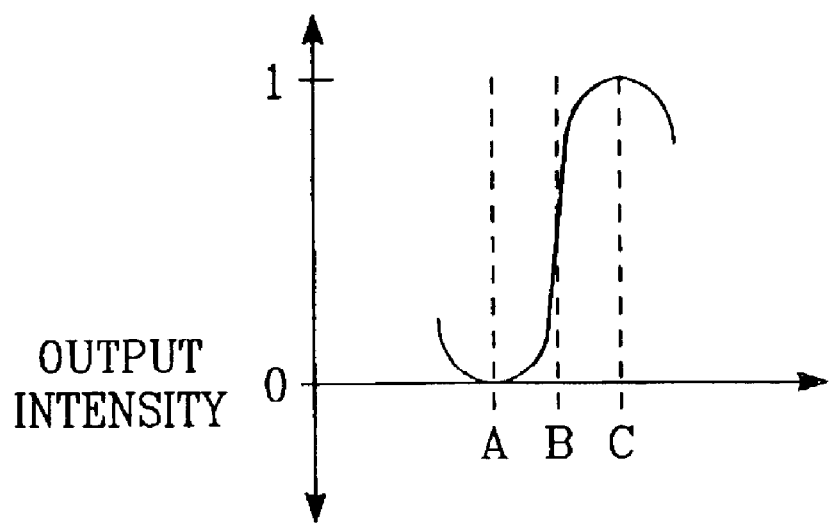

FIGS. 3A through 3H illustrate the push-pull operation in detail. A sinusoidal information signal is illustrated in FIG. 3A, and may be referred to as the RF modulation. The resulting modulation of the reverse bias voltage in the first optical phase shifter 150a is illustrated in FIG. 3B. In FIG. 3B, the reverse bias voltage has a D.C. offset level of about −0.1 volt, for example. The modulation signal has a peak-to-peak swing approximately equal to the quarter wavelength excursion voltage of the optical phase shifter, which is about 45 mV in this example. The resulting phase shift imposed by the optical phase shifter 150a is illustrated in FIG. 3C, and has a range from 0 to a quarter wavelength. FIG. 3D illustrates the RF modulation applied to the second optical phase shifter 150b, which is the inverse of the RF modulation of FIG. 3A. The resulting modulation of the reverse bias voltage in the second optical phase shifter 150b is illustrated in FIG. 3E. As in the first optical phase shifter, the modulation in the second optical phase shifter has a quarter wavelength excursion voltage of about 45 millivolts. The resulting phase shift in the second optical modulator is shown in FIG. 3F. Comparing FIGS. 3C and 3F together, it is seen that the phase shifts in the two phase shifters 150a, 150b move in opposing directions (relative to zero phase) because the RF modulation signals applied to each (FIGS. 3A and 3D) are inverses of one another. The phase difference between the two phase shifters 150a, 150b is obtained by summing the curves of FIGS. 3C and 3F together, the result being illustrated in FIG. 3G, and the corresponding optical output intensity at the beam combiner 145 is illustrated in FIG. 3H.

Figure 4A:
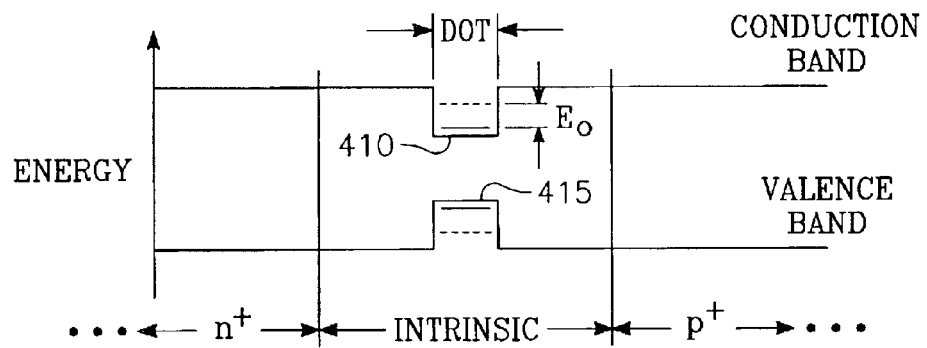
FIGS. 4A, 4B and 4C illustrate the valence-conduction energy band structure of the intrinsic layer under three respective reverse bias voltage levels, beginning at zero voltage.

The phase shift imposed by each phase shifter 150a, 150b changes as the reverse bias voltage changes because changes in reverse bias alter the index of refraction of the crystalline intrinsic layer 220 of the optical phase shifter through the quantum-confined Stark effect. FIG. 4A illustrates the conduction and valence band energies in the absence of a bias voltage across a region of the intrinsic layer 220 that includes a quantum dot. The quantum dot forms a well 415 in the valence band that tightly binds exciton hole states and a well 410 in the conduction band that tightly binds exciton electron states. The energy levels of these exciton states are so sharply defined that they have optical-like transitions characteristic of atomic structure. Formation of exciton electron-hole pairs in the intrinsic layer 220 are captured by the potential wells 410, 415 formed by the quantum dots. The sharpness of the exciton energy levels arises from the depth of the potential wells formed by the quantum dots 230.

Figure 4B:
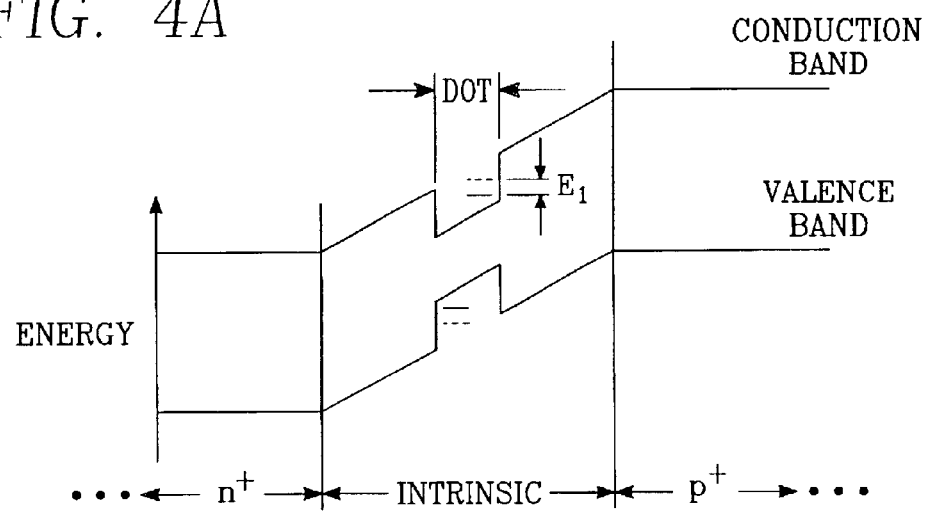
Figure 4C:
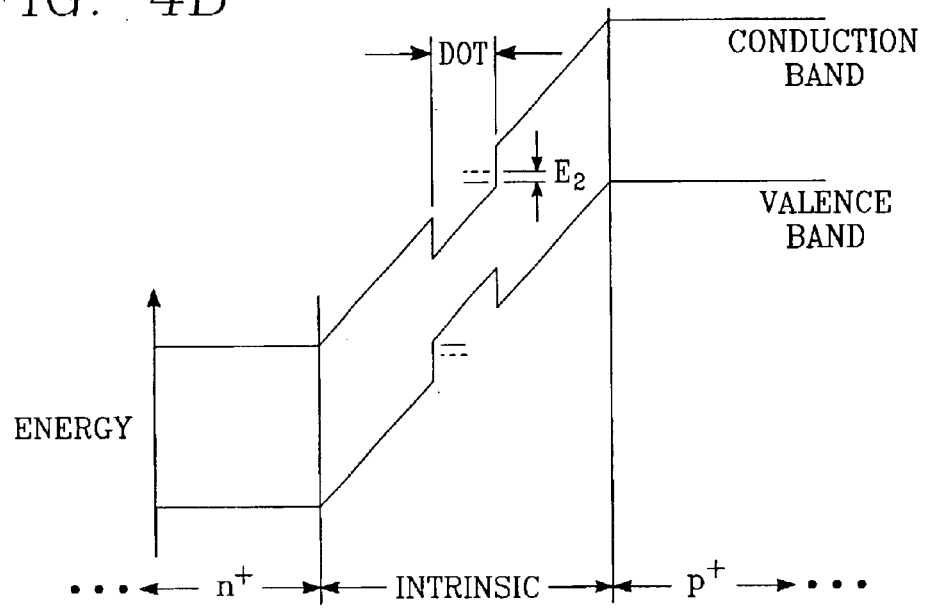
Figure 5A:
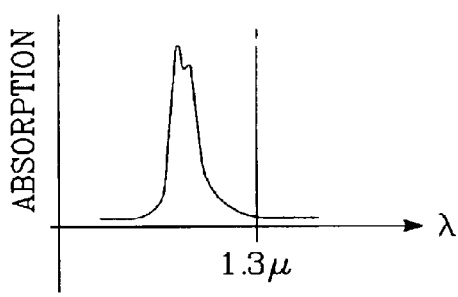
FIGS. 5A, 5B and 5C illustrate exciton state optical absorption line spectra corresponding to FIGS. 4A, 4B and 4C, respectively.

According to quantum mechanics, the greater depth of the potential well confining the exciton state reduces its spontaneous decay probability and lengthens its lifetime accordingly, so that its energy is more sharply defined. One such exciton energy state, for example, corresponds to a sharp absorption line illustrated in the graph of FIG. 5A. The solid line curve in FIG. 5A is the absorption line of the phase shifter 150a. The structure of the intrinsic layer 220 and of the quantum dots 230 in the phase shifter 150a is chosen so that the absorption line wavelength (FIG. 5A) is near, but blue-shifted from the laser beam wavelength at zero bias voltage. The Stark effect in such quantum-confined exciton states arises as follows: As the reverse bias voltage is increased from zero to a finite value, the band structure shifts (from FIG. 4A to FIG. 4B). The increase in reverse bias voltage also causes the exciton energy states to shift down in energy so that the spacing between the energy levels of the exciton hole and electron states decreases. This shifts the ground state absorption line down in energy (towards longer wavelengths) toward the laser beam wavelength (solid line curve of FIG. 5B). A further increase in reverse bias voltage produces a greater shift in band structure (FIG. 4C) in which the exciton energy levels are further compressed, so that the ground state absorption line moves even closer to the laser beam wavelength (solid line curve of FIG. 5C). This apparent loss in energy of the excitons in effect provides the energy to alter the crystalline intrinsic layer 220 so as to shift ts index of refraction. Such a shift in index of refraction of the intrinsic layer 220 changes the phase of the laser beam, since the laser beam is mainly confined to the intrinsic layer 220.

Figure 6A:
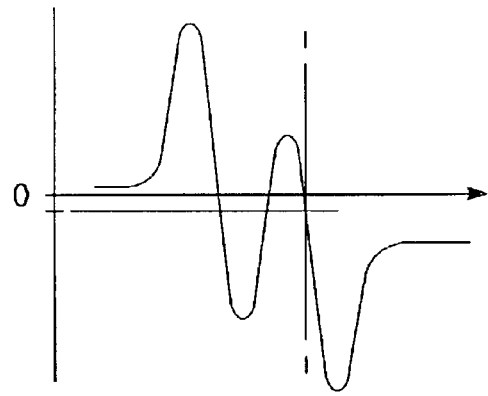
FIGS. 6A, 6B and 6C illustrate refractive index as functions of wavelength corresponding to FIGS. 5A, 5B and 5C, respectively.
Figure 5B:
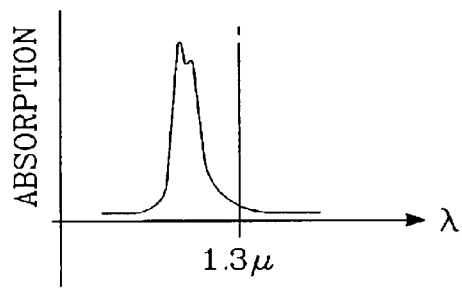
Figure 6B:
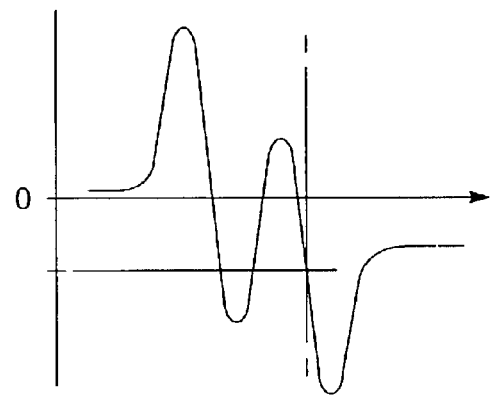
Figure 5C:
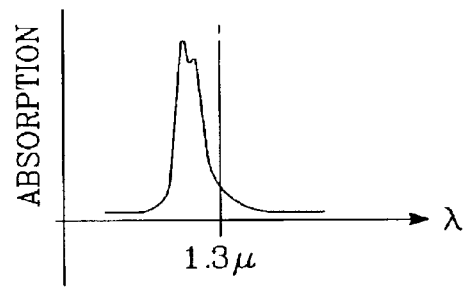
Figure 6C:
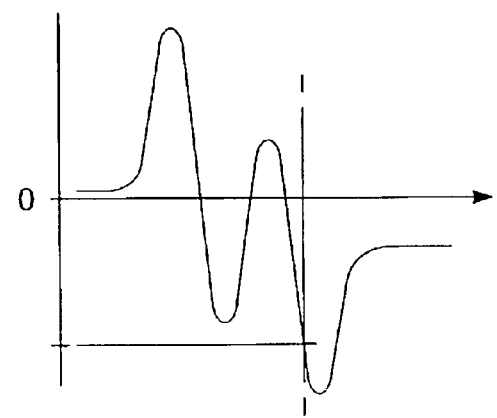
Figure 7:
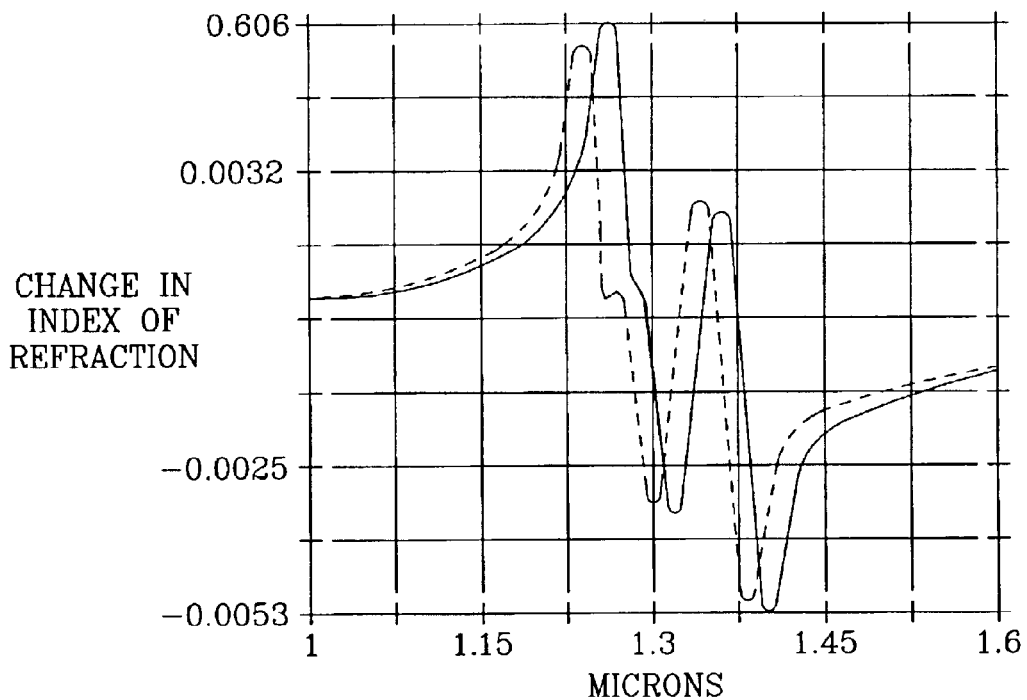
FIG. 7 illustrates a superposition of two different indices of refraction corresponding to FIGS. 6B and 6C.
Figure 8:
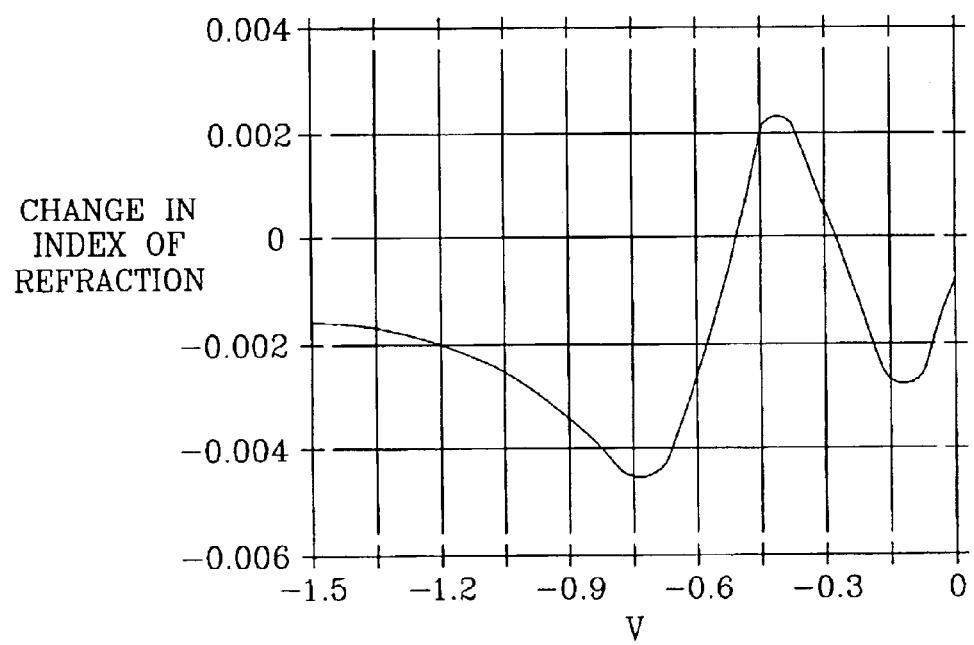
FIG. 8 illustrates change in refractive index as a function of reverse bias voltage.

Because the index of refraction as a function of wavelength is the Hilbert transform of the absorption spectrum, the changes in the absorption spectra illustrated by the solid line curves in FIGS. 5A through 5C produce corresponding changes in refractive index shown in FIGS. 6A through 6C respectively. In the example given here, the 1.3 micron wavelength line of the laser beam lies on a steep or sharply defined region of the refractive index curve of FIGS. 6A through 6C, so that the small shift in instantaneous field shown in FIGS. 6A through 6C produces a large change in refractive index at the laser beam wavelength, which is sufficiently detuned from the absorption line. FIG. 7 illustrates two refractive index curves, one corresponding to the biased state of the modulator of FIG. 5A and the other (dashed line) produced by applying an instantaneous voltage (FIG. 5B or 5C). FIG. 8 shows in this example how a change in the index of refraction (electro-refraction) is a function of the reverse bias voltage. The greatest change in the index of refraction is found at certain bias voltage operating points, specifically, in this example, at −0.1 volts, −0.4 volts and −0.7 volts. By setting the reverse bias voltage D.C. level at one of these optimal operating points, the quarter wavelength excursion voltage is greatly reduced.

As described above, the two phase shifters 150a, 150b are operated in push-pull mode so that their bias voltages are modulated by the information signal and the inverse of the information signal, respectively.

Figure 9:
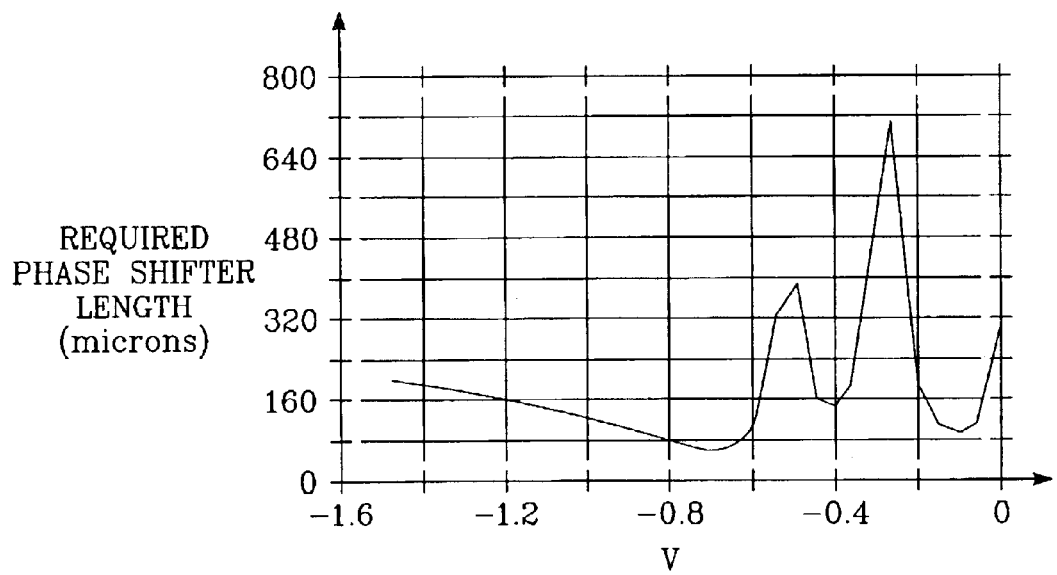
FIG. 9 the phase shifter length required to realize a quarter wavelength phase shift as a function of reverse bias voltage.

The quarter wavelength excursion voltage (the bias voltage swing required to realize a quarter wavelength phase shift) can be minimized by an optimal choice of reverse bias voltage operating point (as discussed above) and by lengthening the optical phase shifter 150 along the direction of laser beam propagation. However, such lengthening increases the insertion loss of from the optical phase shifter. FIG. 9 illustrates the phase shifter length required to realize a phase shift of a quarter wavelength for a laser beam wavelength of 1.3 microns at various reverse bias voltages, in this example. FIG. 9 shows that the D.C. bias voltages at which minimum phase shifter lengths are realized coincide with the optimal bias voltages of FIG. 8 at which maximum change in refractive index occurred. From FIG. 9, it appears that the phase shifter length may be as small as 80 to 100 microns at the ideal operating points (−0.1, −0.4 and −0.7 volts of bias). Such a small length minimizes insertion losses.

Figure 10:
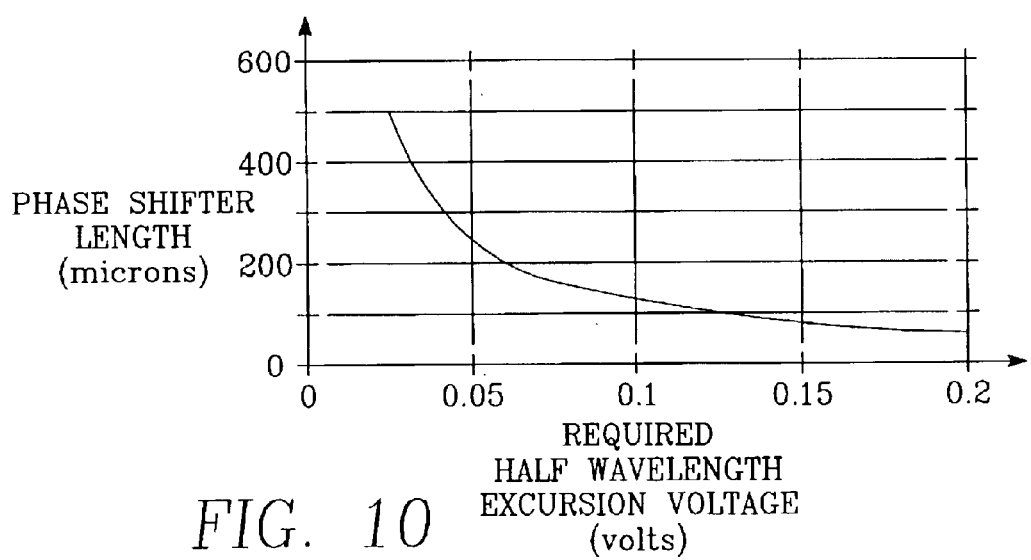
FIG. 10 illustrates phase shifter length required to realize a quarter wavelength phase shift as a function of voltage.
Figure 11:
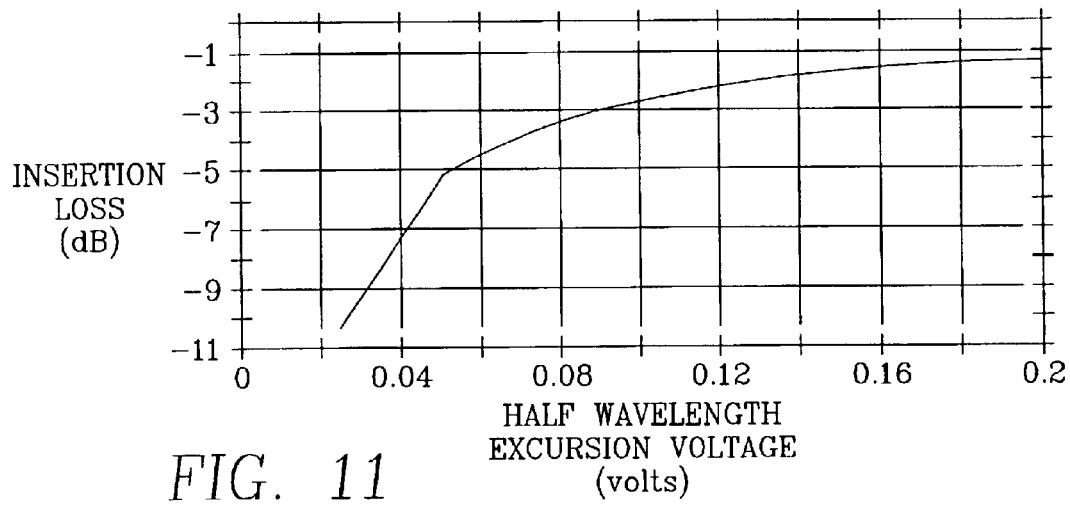
FIG. 11 illustrates insertion loss as a function of the quarter wavelength excursion voltage.
Figure 12:
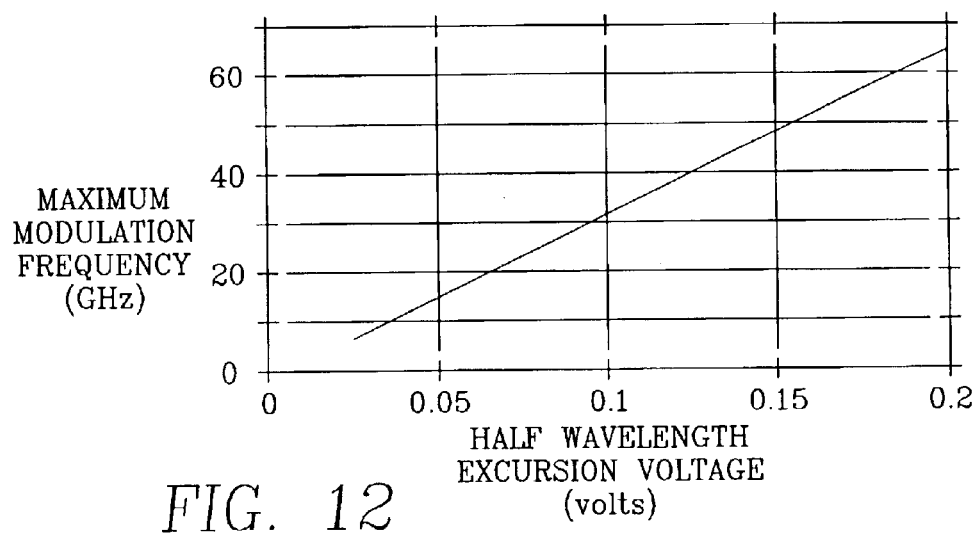
FIG. 12 illustrates RF modulation frequency at 50 Ohms load impedance as a function of quarter wavelength excursion voltage.

As referred to previously herein, only a small voltage (small quarter wavelength excursion voltage) is required to produce the opposing quarter wavelength phase shifts in the optical phase shifters 150a, 150b. This permits increases in bandwidth of the information signal (RF modulation) by permitting smaller RF modulation amplitudes. The quarter wavelength excursion voltage can be as small as 45 mV, for example. FIG. 10 shows how the optical phase shifter length affects the quarter wavelength excursion voltage. By increasing the optical phase shifter length above 100 microns, the required RF modulation (i.e., the quarter wavelength excursion voltage) is as little as about 0.09 V, or about 45 mV for each of the two complementary optical phase shifters 150a, 150b. On the other hand, any further increase in optical phase shifter length leads to significant insertion losses, as shown in FIG. 11. FIG. 11 shows how the insertion loss increases as the half wavelength excursion voltage decreases, because of the required increase in optical shifter length. At a half wavelength excursion voltage of 0.09 V (or 45 mV for a pair of complementary optical phase shifters 150a, 150b), the insertion loss is acceptable at about −3dB. FIG. 12 shows how the maximum RF modulation frequency at 50 Ohms impedance increases with increasing quarter wavelength excursion voltage. From FIG. 12, it is seen that the half wavelength excursion voltage can be as little as 0.09 V (i.e., 45 mV for each of the complementary optical phase shifters 150a, 150b) for 30 GHz RF maximum modulation frequency at 50 Ohms. Thus, the quantum-confined Stark effect optical modulators 150a, 150b require only a very small quarter wavelength excursion voltage while imposing only a very small insertion loss and permitting a high RF modulation frequency at 50 Ohms load impedance.

While the optical modulator of FIG. 1 has a pair of complementary optical phase shifters 150a, 150b in the respective interferometer branches 140a, 140b, it is possible to eliminate one of the two optical phase shifters, so that only one branch of the interferometer has an optical modulator. Such an implementation, however, would require twice the RF modulation excursion to achieve full modulation of the optical output intensity from the interferometer. Thus, in the example described above, the quarter wavelength excursion voltage would be 90 mV with a single optical phase shifter, instead of 45 mV.

In summary, the optical modulator of the invention employs an optical phase shifter in which an optical waveguide is a PIN structure with quantum dots in the intrinsic layer sufficient to confine a significant population of exciton states. Changing the reverse bias voltage on the p-i-n structure causes a phase shift. The refractive index is highly sensitive to changes in reverse bias voltage, so that the bias excursion voltage required to realize a quarter wavelength phase shift is extremely small.

While the invention has been described in detail by reference to preferred embodiments, it is understood that variations and modifications thereof may be made without departing from the true spirit and scope of the invention.

What is claimed is:

1. An optical modulation apparatus for producing a laser beam modulated by a modulation signal, comprising:

an interferometer having a beam splitter, first and second parallel optical branches fed by said beam splitter and a beam combiner fed by said first and second parallel optical branches;

a laser for furnishing said laser beam to said interferometer, said laser having a laser wavelength;

first and second optical phase shifters in respective ones of said first and second parallel optical branches, each one of said first and second optical phase shifters comprising:

(a) an intrinsic semiconductor crystalline planar layer and p-type and n-type planar semiconductor layers on opposite faces of said intrinsic semiconductor crystalline planar layer, said intrinsic layer lying in a plane parallel to a direction of propagation of said laser beam in the respective optical branch;

(b) plural layers of planar arrays of quantum dots in said intrinsic layer, said intrinsic layer having an absorption spectrum with a predominant peak, said peak being shifted from said laser wavelength such that said laser wavelength lies in one of plural regions of steepest change of a refractive index of said intrinsic layer as a function of wavelength;

(c) a reverse bias D.C. voltage source connected across said p-type and n-type layers and having a bias voltage lying in one of plural regions of steepest change in said index of refraction as a function of wavelength;

(d) a pair of modulation source terminals connected across said reverse bias D.C. voltage source whereby a modulation signal modulates the reverse bias voltage across said p-type and n-type layers.

2. The apparatus of claim 1 wherein said modulation source terminals of said first and second optical phase shifters are connected in opposite polarity to a common modulation source.

3. The apparatus of claim 2 wherein said intrinsic layer undergoes a change in refractive index sufficient to impose a quarter wavelength phase shift in response to a modulation signal increase by a quarter wavelength excursion voltage of said intrinsic layer.

4. The apparatus of claim 3 wherein said quantum dots in said intrinsic layer promote quantum-confined exciton states defining an exciton optical absorption line spectrum, said quantum-confined states decreasing in energy level upon increase of said reverse bias voltage.

5. The apparatus of claim 4 wherein a phase difference between said first and second optical phase shifters varies between zero and a half wavelength of said laser wavelength for a variation in the modulation signal between zero and the quarter wavelength excursion voltage.

6. The apparatus of claim 1 wherein each of said optical phase shifters produces a quarter wavelength phase shift whenever said reverse bias voltage is increased by a quarter wavelength excursion voltage, said first and second optical phase shifters being operated in push-pull mode whereby a quarter wavelength shift in each optical phase shifter produces a total phase shift of a half wavelength between said first and second phase shifter.

7. The apparatus of claim 1 wherein said p-type and n-type layers confine a major portion of said laser beam to said intrinsic layer.

8. The apparatus of claim 1 wherein said p-type and intrinsic layers are formed of a semiconductor material having a band gap greater than the photon energy of the laser beam, said quantum dots having a size such that excitons created in their vicinity are strongly confined.

9. The apparatus of claim 3 wherein said quantum dots have a diameter, height and layer-to-layer spacing sufficient to form potential wells capable of capturing exciton electron-hole pairs with sufficient binding energy to create optical-like transition energy spectra at an energy appropriate to the intended optical carrier frequency.

10. The apparatus of claim 9 wherein said transition energy spectra undergo a Stark effect downward shift in response to an increase in said reverse bias voltage with a corresponding shift in refractive index of said intrinsic layer, said shift in refractive index being sufficient to impose a phase shift on said laser beam in said intrinsic layer equal to a quarter wavelength of said laser wavelength whenever said increase in said reverse bias voltage reaches a quarter wavelength excursion voltage of said intrinsic layer.

11. The apparatus of claim 1 wherein said peak of said absorption spectrum is blue-shifted from said laser wavelength.

12. An optical phase shifter capable of interacting with a light beam of a particular laser wavelength passing therethrough, comprising:

(a) an intrinsic semiconductor crystalline planar layer and p-type and n-type planar semiconductor layers on opposite faces of said intrinsic semiconductor crystalline planar layer, said intrinsic layer lying in a plane parallel to a direction of propagation of said light beam in the respective optical branch;

(b) plural layers of planar arrays of quantum dots in said intrinsic layer, said intrinsic layer having an absorption spectrum with a predominant peak, said peak being shifted from said laser wavelength such that said laser wavelength lies in one of plural regions of steepest change of a refractive index of said intrinsic layer as a function of wavelength;

(c) a reverse bias D.C. voltage source connected across said p-type and n-type layers and having a bias voltage lying in one of plural regions of steepest change in said index of refraction as a function of bias voltage;

(d) a pair of modulation source terminals connected across said reverse bias D.C. voltage source whereby a modulation signal modulates the reverse bias voltage across said p-type and n-type layers.

13. The apparatus of claim 12 wherein said intrinsic layer undergoes a change in refractive index sufficient to impose a quarter wavelength phase shift in response to a modulation signal increase by a quarter wavelength excursion voltage of said intrinsic layer.

14. The apparatus of claim 12 wherein:

said quantum dots in said intrinsic layer anchor quantum-confined exciton states defining an exciton optical absorption line spectrum, said quantum-confined states decreasing in energy level upon increase of said reverse bias voltage; and an exciton absorption line spectrum of one of said exciton states is offset from the wavelength of said light beam.

15. The apparatus of claim 12 wherein said optical phase shifter produces a quarter wavelength phase shift whenever said reverse bias voltage is increased by a quarter wavelength excursion voltage of said intrinsic layer.

16. The apparatus of claim 12 wherein said p-type and n-type layers confine a major portion of said light beam to said intrinsic layer.

17. The apparatus of claim 12 wherein said p-type, n-type and intrinsic layers are formed of a semiconductor material having a band gap corresponding at least generally to the wavelength of said light beam.

18. The apparatus of claim 17 wherein said quantum dots have a diameter, height and layer-to-layer spacing sufficient to form a potential wells capable of capturing exciton electron-hole pairs with sufficient binding energy to create optical-like transition energy spectra.

19. The apparatus of claim 12 wherein said peak of said absorption spectrum is blue-shifted from said laser wavelength.

20. An optical modulator for modulating a laser beam of a laser wavelength with a modulation signal, comprising:
   an interferometer having a beam splitter, first and second parallel optical branches fed by said beam splitter and a beam combiner fed by said first and second parallel optical branches;
   first and second optical phase shifters in respective ones of said first and second parallel optical branches, each one of said first and second optical phase shifters comprising:
      (a) an intrinsic semiconductor crystalline planar layer and p-type and n-type planar semiconductor layers on opposite faces of said intrinsic semiconductor crystalline planar layer, said intrinsic layer lying in a plane parallel to a direction of propagation of said laser beam in the respective optical branch;
      (b) plural layers of planar arrays of quantum dots in said intrinsic layer, said quantum dots having a diameter, height and layer-to-layer spacing sufficient to form a potential wells capable of capturing exciton electron-hole pairs with sufficient binding energy to create optical-like transition energy spectra, said intrinsic layer having an absorption spectrum with a predominant peak, said peak being shifted from said laser wavelength such that said laser wavelength lies in one of plural regions of steepest change of a refractive index of said intrinsic layer as a function of wavelength;
      (c) a reverse bias D.C. voltage source connected to said p-type and n-type layers and having a bias voltage lying in one of plural regions of steepest change in said index of refraction as a function of bias voltage;
      (d) a pair of modulation source terminals connected to said reverse bias D.C. voltage source whereby a modulation signal modulates the reverse bias voltage across said intrinsic layer, wherein said transition energy spectra undergo a Stark effect downward shift in wavelength in response to an increase in said reverse bias voltage with a corresponding shift in refractive index of said intrinsic layer, said shift in refractive index being sufficient to impose a phase shift on said laser beam in said intrinsic layer equal to a quarter wavelength of said laser beam whenever said increase in said reverse bias voltage reaches a quarter wavelength excursion voltage of said intrinsic layer.

21. The apparatus of claim 20 wherein said modulation source terminals of said first and second optical phase shifters are connected in opposite polarity (180° out-of-phase) to a common modulation source.

22. The apparatus of claim 21 wherein said intrinsic layer undergoes a change in refractive index sufficient to impose a quarter wavelength phase shift in response to a modulation signal increase by a quarter wavelength excursion voltage of said intrinsic layer.

23. The apparatus of claim 22 wherein:
   said quantum dots in said intrinsic layer promote quantum-confined exciton states defining an exciton optical absorption line spectrum, said quantum-confined states decreasing in energy level upon increase of said reverse bias voltage.

24. The apparatus of claim 23 wherein a phase difference between said first and second optical phase shifters varies between zero and a half wavelength of said laser for a variation in the modulation signal between zero and the quarter wavelength excursion voltage.

25. The apparatus of claim 20 wherein each of said optical phase shifters produces a quarter wavelength phase shift whenever said reverse bias voltage is increased by a quarter wavelength excursion voltage, said first and second optical phase shifters being operated in push-pull mode whereby a quarter wavelength shift in each optical phase shifter produces a total phase shift of a half wavelength between said first and second phase shifters.

26. The apparatus of claim 20 wherein said p-type and n-type layers confine a major portion of said laser beam to said intrinsic layer.

27. The apparatus of claim 20 wherein said p-type, n-type and intrinsic layers are formed of a semiconductor material having a band gap corresponding to and offset from the photon energy of said laser beam.

28. The apparatus of claim 20 further comprising a laser for furnishing said laser beam to said beam splitter, said laser, said interferometer and said optical phase shifters being formed as integrated semiconductor crystalline structures on a semiconductor substrate.

29. The apparatus of claim 20 wherein said peak of said absorption spectrum is blue-shifted from said laser wavelength.

* * * * *